(12) United States Patent
Chen

(10) Patent No.: US 8,115,871 B2
(45) Date of Patent: Feb. 14, 2012

(54) VIDEO TOP-OF-FRAME SIGNAL GENERATOR FOR MULTIPLE VIDEO FORMATS

(75) Inventor: Dongwei Chen, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 975 days.

(21) Appl. No.: 12/102,278

(22) Filed: Apr. 14, 2008

(65) Prior Publication Data

US 2009/0256960 A1    Oct. 15, 2009

(51) Int. Cl.
H04N 5/06 (2006.01)

(52) U.S. Cl. ........ 348/521; 348/522; 348/524; 348/540; 348/547; 375/355

(58) Field of Classification Search .................. 348/521, 348/522, 524, 540, 547, 525; 375/355, 363–366
See application file for complete search history.

(56) References Cited

U.S. PATENT DOCUMENTS

| 5,132,793 | A | * | 7/1992 | Hirahata et al. ............ 348/556 |
| 6,473,195 | B1 | | 10/2002 | Yun et al. |
| 7,777,813 | B2 | * | 8/2010 | Uno et al. ..................... 348/506 |
| 8,059,200 | B2 | * | 11/2011 | Chen ............................ 348/536 |
| 2006/0017984 | A1 | | 1/2006 | Lee |

OTHER PUBLICATIONS

International Search Report corresponding to PCT/US2009/039617 filed Apr. 6, 2009, 3 pages.
Written Opinion of the International Searching Authority corresponding to PCT/US2009/039617 filed Apr. 6, 2009, 4 pages.
Lattice Semiconductor Corporation, "SMPTE SDI Demo User's Guide", Nov. 2007, pp. 1-23.
Gennum, GS4911B/GS4910B Data Sheet, "GS4911B/GS4910B HD/SD/ Graphics Clock and Timing Generator with GENLOCK", Apr. 2007, pp. 1-113.

* cited by examiner

Primary Examiner — Brian T Pendleton
Assistant Examiner — Nnenna Ekpo

(57) ABSTRACT

A signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate.

18 Claims, 4 Drawing Sheets

VIDEO TOP-OF-FRAME SIGNAL GENERATOR FOR MULTIPLE VIDEO FORMATS

BACKGROUND

1. Field of the Invention

The present invention relates to clock generator circuits, and in particular, to clock generator circuits for generating video clock signals.

2. Related Art

In recent years, sources of and uses for video image data have increased dramatically. As a result, it has become increasingly important for video image systems to be capable of processing (e.g., capturing, converting, editing and displaying) video image information in accordance with a number of different formats. Further, concurrent with increases in sophistication of such systems have been advances in miniaturization. Accordingly, it has become increasingly desirable to have a single-chip solution for providing video interface and clock signals to support multiple formats.

SUMMARY

In accordance with the presently claimed invention, a signal generator and method are provided for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate In accordance with one embodiment of the presently claimed invention, a signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate includes:

gating circuitry responsive to input vertical and horizontal reference signals by providing a gated signal, wherein the input vertical reference signal is related to a vertical video synchronization signal for the input video signal, the input horizontal reference signal is related to a horizontal video synchronization signal for the input video signal, and the gated signal represents the input video frame;

first counter circuitry coupled to the gating circuitry and responsive to the gated signal, first count control data and a first reset signal by providing a first count signal, wherein the first count control data is related to a ratio of the input and output video frame rates;

second counter circuitry coupled to the first counter circuitry and responsive to the first count signal, second count control data and the input horizontal reference signal by providing a second count signal, wherein the second count control data is related to a predetermined line of the output video frame; and third counter circuitry coupled to the second counter circuitry and responsive to an input reference clock signal related to the input horizontal video synchronization signal, third count control data and the second count signal by providing a third count signal, wherein the third count control data is related to a reference plurality of video frame lines for a reference video frame having a reference video frame rate, and the third count signal is related to the output video frame rate.

In accordance with another embodiment of the presently claimed invention, a signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate includes:

gating means for receiving input vertical and horizontal reference signals and in response thereto providing a gated signal, wherein the input vertical reference signal is related to a vertical video synchronization signal for the input video signal, the input horizontal reference signal is related to a horizontal video synchronization signal for the input video signal, and the gated signal represents the input video frame;

first counter means for receiving the gated signal, first count control data and a first reset signal and in response thereto providing a first count signal, wherein the first count control data is related to a ratio of the input and output video frame rates;

second counter means for receiving the first count signal, second count control data and the input horizontal reference signal and in response thereto providing a second count signal, wherein the second count control data is related to a predetermined line of the output video frame; and third counter means for receiving an input reference clock signal related to the input horizontal video synchronization signal, third count control data and the second count signal and in response thereto providing a third count signal, wherein the third count control data is related to a reference plurality of video frame lines for a reference video frame having a reference video frame rate, and the third count signal is related to the output video frame rate.

In accordance with still another embodiment of the presently claimed invention, a method for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate includes:

receiving input vertical and horizontal reference signals and in response thereto providing a gated signal, wherein the input vertical reference signal is related to a vertical video synchronization signal for the input video signal, the input horizontal reference signal is related to a horizontal video synchronization signal for the input video signal, and the gated signal represents the input video frame;

receiving first count control data and a first reset signal and in response thereto counting the gated signal to provide a first count signal, wherein the first count control data is related to a ratio of the input and output video frame rates;

receiving second count control data and the input horizontal reference signal and in response thereto counting the first count signal to provide a second count signal, wherein the second count control data is related to a predetermined line of the output video frame; and receiving third count control data and the second count signal and in response thereto counting an input reference clock signal related to the input horizontal video synchronization signal to provide a third count signal, wherein the third count control data is related to a reference plurality of video frame lines for a reference video frame having a reference video frame rate, and the third count signal is related to the output video frame rate.

DETAILED DESCRIPTION

Figure 1:
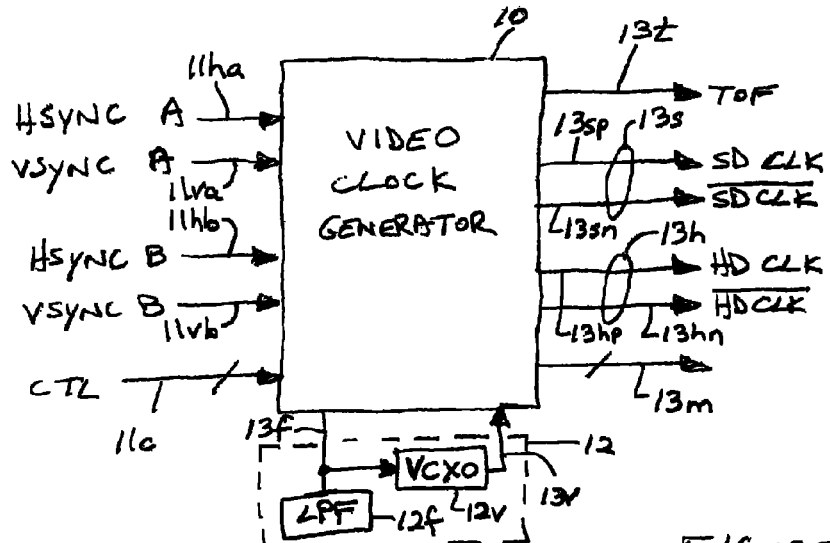
FIG. 1 identifies input and output signals of a video clock generator in accordance with one embodiment of the presently claimed invention.

The following detailed description is of example embodiments of the presently claimed invention with references to the accompanying drawings. Such description is intended to be illustrative and not limiting with respect to the scope of the present invention. Such embodiments are described in sufficient detail to enable one of ordinary skill in the art to practice the subject invention, and it will be understood that other embodiments may be practiced with some variations without departing from the spirit or scope of the subject invention.

Throughout the present disclosure, absent a clear indication to the contrary from the context, it will be understood that individual circuit elements as described may be singular or plural in number. For example, the terms "circuit" and "circuitry" may include either a single component or a plurality of components, which are either active and/or passive and are connected or otherwise coupled together (e.g., as one or more integrated circuit chips) to provide the described function. Additionally, the term "signal" may refer to one or more currents, one or more voltages, or a data signal. Within the drawings, like or related elements will have like or related alpha, numeric or alphanumeric designators. Further, while the present invention has been discussed in the context of implementations using discrete electronic circuitry (preferably in the form of one or more integrated circuit chips), the functions of any part of such circuitry may alternatively be implemented using one or more appropriately programmed processors, depending upon the signal frequencies or data rates to be processed.

A video clock generator in accordance with the presently claimed invention provides multiple video clock signals having different clock rates. Such a clock generator can be advantageously used in a wide range of video applications, including video genlock, SDI serializers and deserializers, video capture, video conversion, video editing, video displays, and other broadcast and professional video systems.

As discussed in more detail below, a video clock generator in accordance with the presently claimed invention can provide multiple standard definition (SD) and high definition (HD) clock signals, and a programmable top-of-frame timing pulse. In a genlock mode of operation, these output signals can be phase-locked to horizontal and vertical synchronization signals applied to either of two multiplexed inputs.

An external, inexpensive, voltage-controlled crystal oscillator (VCXO, e.g., at 27.0000 megahertz) can be used to operate this video clock generator for any mode of operation. This avoids any need for discrete or field programmable gate array (FPGA) PLLs with multiple VCXOs, while providing output clocks signals with minimal clock jitter. (Additional information on a commercial product embodying a video clock generator in accordance with the presently claimed invention can be found in a preliminary data sheet dated Feb. 28, 2008, and a preliminary application note dated Jan. 28, 2008, filed herewith as Appendices A and B, respectively, for commercial part LMH1982 by the assignee, National Semiconductor Corporation.)

Referring to FIG. 1, a video clock generator 10 in accordance with one embodiment of the presently claimed invention receives two sets of horizontal $11ha$, $11hb$ and vertical $11va$, $11vb$ synchronization signals. These synchronization signals $11ha$, $11va$, $11hb$, $11vb$ can be obtained by stripping the horizontal and vertical synchronization information from video signals in accordance with well known principles. A number of control signals $11c$ are also received for either controlling the video clock generator 10 directly or providing control data for on-chip storage and later use.

The output signals include a standard definition pixel clock signal $13s$, a high definition pixel clock signal $13h$, a top-of-frame (TOF) signal $13t$, and some additional signals $13m$ for providing status information or additional control signals for use elsewhere, e.g., within the host system (not shown). In accordance with a preferred embodiment, the clock signals $13s$, $13h$ are provided as differential signals (e.g., low voltage differential signals) having positive $13sp$, $13hp$ and negative $13sn$, $13hn$ signal phases in accordance with well known principles.

An external voltage-controlled oscillator (VCO) assembly 12 having a low pass loop filter $12f$ and a VCXO $12v$ provides an oscillator signal $13v$ for use as a reference signal by the video clock generator 10, which, in turn, provides the oscillator control signal $13f$.

Figure 2:
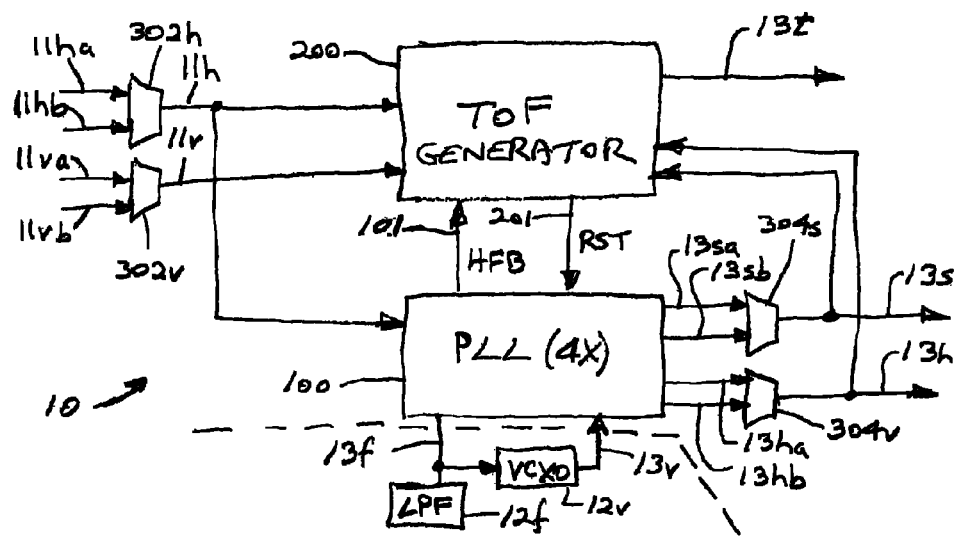
FIG. 2 is a functional block diagram of one example embodiment of the video clock generator of FIG. 1.

Referring to FIG. 2, the video clock generator 10 includes a PLL block 100 (discussed in more detailed below) and a TOF generator 200 (discussed in more detailed below). Also included are input signal multiplexors $302h$, $302v$ to select among the incoming horizontal $11ha$, $11hb$ and vertical $11va$, $11vb$ synchronization signals for routing as the internal horizontal $11h$ and vertical $11v$ synchronization signals, and output signal multiplexors $304s$, $304h$ to select among multiple standard definition $13sa$, $13sb$ and high definition $13ha$, $13hb$ pixel clock signals for use as the output standard definition $13s$ and high definition $13h$ pixel clock signals. The TOF generator 200 provides the TOF signals $13t$ while exchanging frequency reference 101 and reset 201 signals with the PLL block 100.

Figure 3:
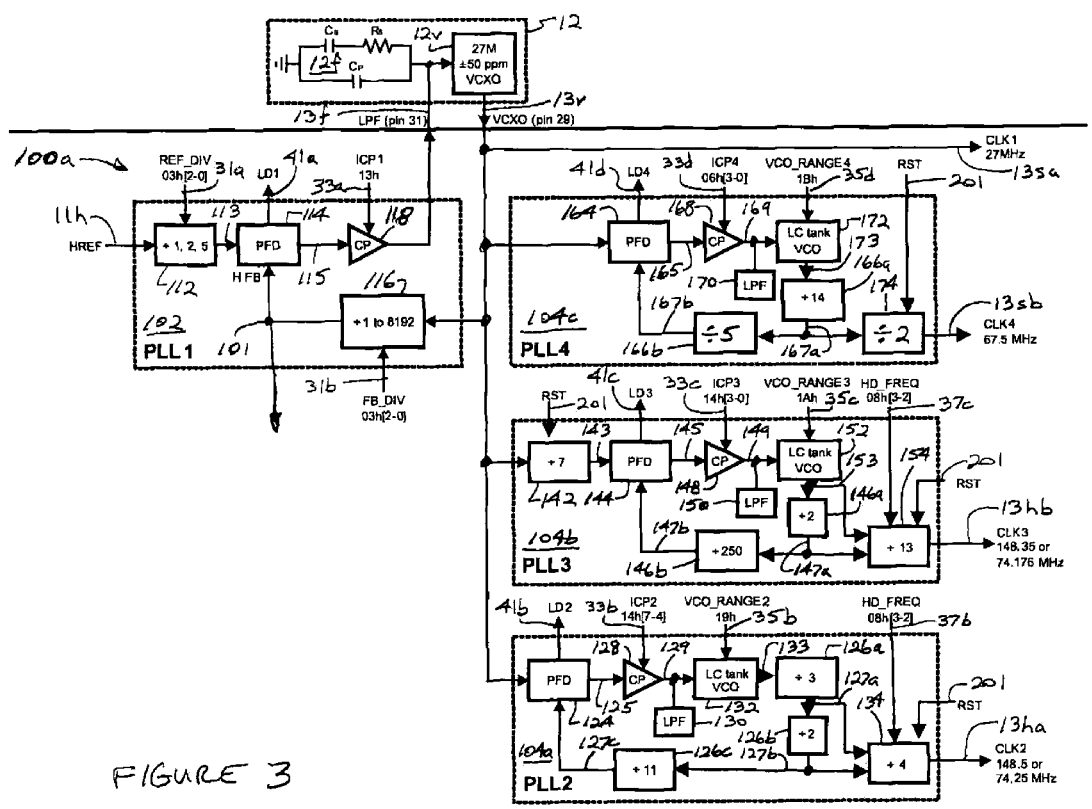
FIG. 3 is a functional block diagram of one example embodiment of the phase-locked loop (PLL) circuitry of FIG. 2.

Referring to FIG. 3, the PLL block 100 in accordance with one embodiment $100a$ of the presently claimed invention includes a master PLL 102 and three slave PLLs $104a$, $104b$, $104c$. The selected horizontal synchronization signal $11h$ is selectively divided in frequency by a programmable frequency divider 112. The resulting signal 113 is compared in phase and frequency with a feedback signal 101 (which is also provided to the TOF generator 200, as noted above) in a phase-frequency detector (PFD) 114. The detection signal 115 drives a charge pump 118, which provides the off-chip control signal $13f$. The off-chip oscillator signal $13v$ is selectively divided in frequency by a programmable feedback frequency divider 116 to provide the feedback signal 101. Frequency divisor data $31a$, $31b$ are provided as desired to the programmable frequency dividers 112, 116, while charge pump control data $33a$ can be provided for controlling the charge pump 118 current.

In the first slave PLL $104a$, the off-chip oscillator signal $13v$ is compared in phase and frequency with a final feedback signal $127c$ in a PFD 124. The detection signal 125 drives a charge pump 128 which provides the control signal 129, filtered by the loop filter 130, for a VCO 132. The oscillator signal 133 is successively divided in frequency by frequency dividers 126*a*, 126*b*, 126*c* to provide the final feedback signal 127*c*. Intermediate feedback signals 127*a*, 127*b* are selected for further frequency division by an output frequency divider 134 which is synchronized with the reset signal 201 (from the TOF generator 200) to produce the first high definition clock signal 13*ha*. Control data 33*b*, 35*b*, 37*b* can be provided for controlling the charge pump 128 current, the frequency range of the VCO 132 and the frequency of the clock signal 13*ha* (by selecting which of the intermediate feedback signals 127*a*, 127*b* is divided by the output frequency divider 134).

In the second slave PLL 104*b*, the off-chip oscillator signal 13*v* is divided by a frequency divider 142, which is synchronized with the reset signal 201. The frequency-divided signal 143 is compared in phase and frequency with a final feedback signal 147*b* in a PFD 144. The detection signal 145 drives a charge pump 148 which provides the control signal 149, filtered by the loop filter 150, for a VCO 152. The oscillator signal 153 is successively divided by frequency dividers 146*a*, 146*b* to provide the final feedback signal 147*b*. Intermediate feedback signals 146*a*, 147*a* are selectively divided in frequency by an output frequency divider 154, which is synchronized with the reset signal 201, to provide another high definition clock signal 13*hb*. Control data 33*c*, 35*c*, 37*c* can be provided for controlling the charge pump 148 current, the frequency range of the VCO 152 and the output frequency of the clock signal 13*hb* (by selecting which of the intermediate feedback signals 146*a*, 147*a* is divided by the output frequency divider 154).

In the third slave PLL 104*c*, the off-chip oscillator signal 13*v* is compared in phase and frequency with a final feedback signal 167*b* in a PFD 164. The detection signal 165 drives the charge pump 168 which provides the control signal 169, filtered by the loop filter 170, for a VCO 172. The oscillator signal 173 is successively divided in frequency by frequency dividers 166*a*, 166*b*. An intermediate feedback signal 167*a* is divided by an output frequency divider 174, synchronized with the reset signal 201, to provide a standard definition clock signal 13*sb*. Control data 33*d*, 35*d* can be provided for controlling the charge pump 168 current and frequency range of the VCO 172.

Based upon the topologies and interconnections of the master 102 and slave 104*a*, 104*b*, 104*c* PLL circuits, in conjunction with the use an off-chip VCXO assembly 12, the master PLL 102 significantly reduces signal jitter due to jitter that may be present in the incoming horizontal synchronization signal 11*h*. Each of the slave PLL circuits 104*a*, 104*b*, 104*c* converts this off-chip oscillator signal 13*v* to the desired output clock signal 13*ha*, 13*hb*, 13*sb* frequency, with the off-chip oscillator signal 13*v* used directly to provide one of the standard definition clock signal 13*sa*, while the other standard definition clock signal 13*sb* is provided by the third slave PLL 104*c*.

For the high definition clock signals 13*ha*, 13*hb*, which are higher in frequency (e.g., 148.5 and 148.35 megahertz), one technique would be to first frequency divide the off-chip oscillator signal 13*v* and multiply it up in frequency within the PLL circuits 104*a*, 104*b* to achieve the desired output frequencies. However, by reducing the input frequency to the PFDs 124, 144, the bandwidths of each PLL 104*a*, 104*b* would need to be quite narrow to minimize loop noise. For example, if the off-chip oscillator signal 13*v* has a frequency of 27 megahertz and is divided by a divisor of 91, the input frequency for the PFD 144 would be 296.7 kilohertz, thereby requiring a PLL bandwidth of 14.8 kilohertz for minimal loop noise. With a bandwidth this narrow, the 1/f noise of the on-chip VCO 152 will contribute significantly to the jitter of the clock signal 13*hb*. Further, when generating such oscillator frequencies on-chip, ring oscillators are often used, and generally with high signal noise.

In accordance with the presently claimed invention, minimum, if any, initial frequency division is used for the off-chip oscillator signal 13*v*. For example, in the second slave PLL 104*b*, the oscillator signal 13*v* is divided in frequency by a low divisor (e.g., by 7), thereby allowing the bandwidth of the PLL 104*b* to be significantly higher (e.g., 13 times higher, 13*7=91). Additionally, this allows the VCO 152 to operate at nearly two gigahertz (e.g., approximately 1928.5 megahertz), thereby allowing a resonant tank VCO circuit to be used with inductive and capacitive components integrated on-chip. As is well known, resonant tank circuit oscillators provide better noise performance than ring oscillators.

Similarly, the first 104*a* and third 104*c* slave PLL circuits also use resonant tank circuit oscillators 132, 172, and operate at nominal frequencies of 1782 and 1890 megahertz respectively.

For each PLL 102, 104*a*, 104*b*, 104*c*, a lock detection status signal 41*a*, 41*b*, 41*c*, 41*d* can be provided by the PFDs 114, 124, 144, 164 for monitoring the phase-lock status of each PLL 102, 104*a*, 104*b*, 104*c*.

Figure 4:
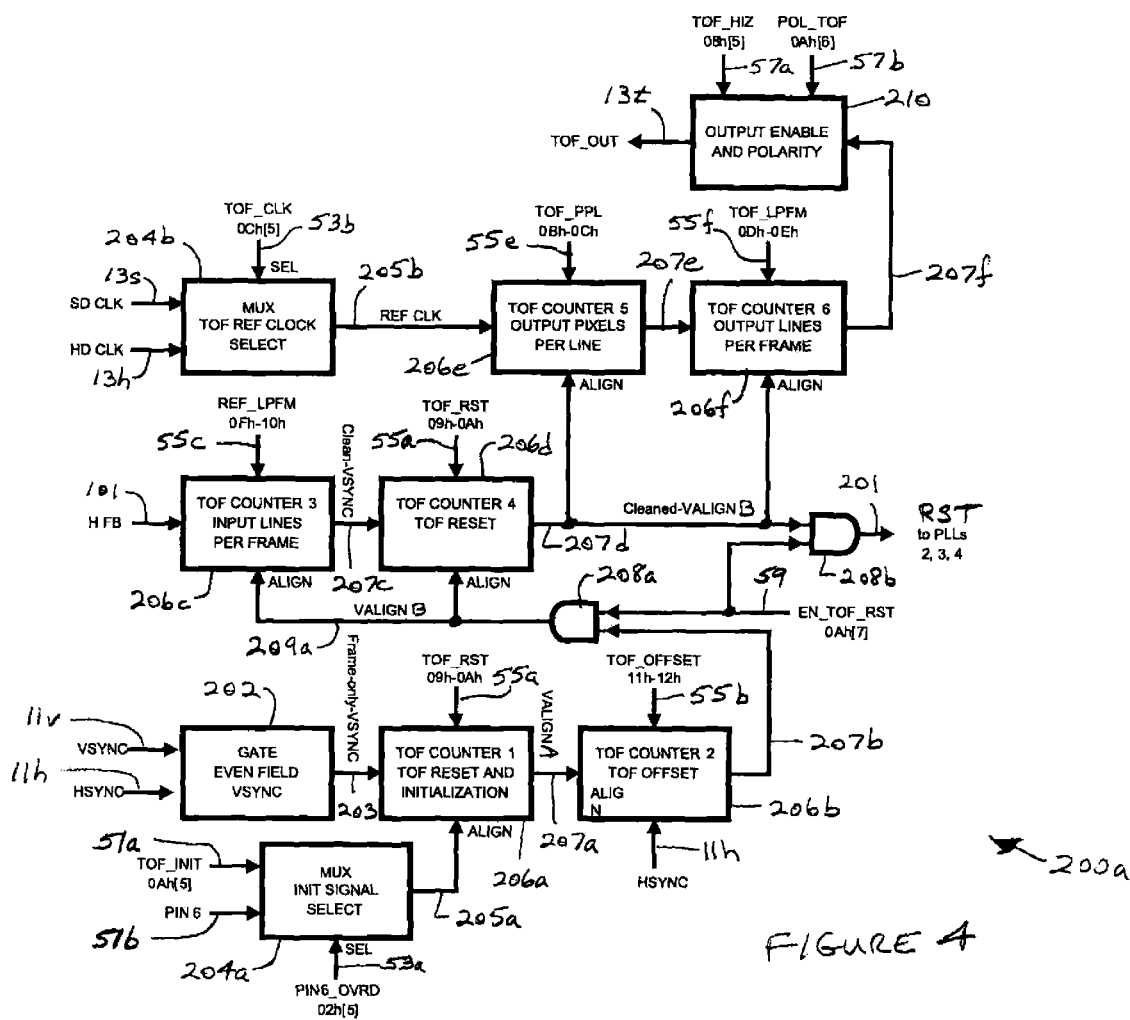
FIG. 4 is a functional block diagram of one example embodiment of the top-of-frame generator of FIG. 2.

Referring to FIG. 4, one example embodiment 200*a* of the TOF generator 200 (FIG. 2) includes a gating circuit 202, multiplexors 204*a*, 204*b*, counter/shifter circuits 206*a*, 206*b*, 206*c*, 206*d*, 206*e*, 206*f*, logic AND gates 208*a*, 208*b*, and output enable and polarity control circuitry 210, interconnected substantially as shown. Monitoring the horizontal 11*h* and vertical 11*v* synchronization signals, the gating circuit 202 removes the portion of the vertical synchronization signal 11*v* corresponding to the even field (field 2) for interlaced video formats, thereby ensuring that only that portion of the vertical synchronization signal 11*v* corresponding to the odd field (field 1) remains so as to properly identify the beginning, i.e., top, of the video frame.

The resulting gated signal 203 is counted down in the first counter 206*a*, in accordance with programmable count data 55*a*. This counter 206*a* is reset by the multiplexed signal 205*a* from the multiplexor 204*a*. Generally, an initialization signal 51*a* is selected as the multiplexed signal 205*a* to ensure that the ultimate TOF 13*t* in phase with the desired input reference frame. However, the multiplexor control signal 53*a* allows an off-chip signal 51*b* to be used as desired.

The first counter output 207*a* is shifted by the second counter 206*b* in accordance with programmable offset data 55*b*, with the resulting output signal 207*b* reset by the horizontal synchronization signal 11*h*. This programmable counter data 55*b* represents the line of the reference frame to which it is desired that the TOF signal 13*t* be aligned. This second counter output signal 207*b*, passed by the logic gate 208*a* when enabled by a control signal 59, serves as the reset signal 209*a* for the third 206*c* and fourth 206*d* counters.

The third counter 206*c* is clocked by the feedback signal 101 from the master PLL 102 (FIG. 3). In accordance with programmable count data 55*c*, this clock signal 101 is divided down to produce a clean vertical synchronization signal 207*c*. This programmable counter data 55*c* represents the reference frame timing and corresponds to the total number of reference lines per frame. The resultant signal 207*c*, in turn, in accordance with the programmable counter data 55*a* also used by the first counter 206*a*, is counted down by the fourth counter 206*d* to ensure its alignment with its reset signal 209*a*.

This programmable counter data 55*a* for the first and fourth counters 206*a*, 206*d* corresponds to the numerator of the ratio of the input frame rate to the output frame rate, with the numerator and denominator reduced to their lowest integer factors. For example, if the input frame rate is 29.97 hertz and the desired output frame rate is 23.976 hertz, then the programmable counter data 55a has a value of five. Accordingly, when the counter input signals, 203, 207c are counted down by this factor of five, it produces five signal phases, one of which is selected by the reset signals 205a, 209a.

The resultant signal 207d serves as the reset signal for the fifth and sixth counters 206e, 206f, and is provided, via logic gate 208b when enabled by the control signal 59, as the reset signal 201 for the slave PLL circuits 104a, 104b, 104c (FIG. 3).

The TOF output signal 13t is derived from a pixel line counter 206e and frame counter 206f, and ultimately synchronized to one of the selected pixel clocks 13s, 13h, depending upon the desired output timing format. Accordingly, the appropriate pixel clock 13s, 13h is selected by the second multiplexor 204b in accordance with programmed selection data 53b.

The resulting reference pixel clock 205b is counted successively by the fifth and sixth counters 206e, 206f in accordance with programmable counter data 55e, 55f. As discussed above, the multiplexor control data 53b specifies the top-of-frame clock frequency. The control data 55e for the pixel counter 206e corresponds to the total output pixel clocks per line. The control data 55f for the frame counter 206f corresponds to the total output lines per frame. Accordingly, the frame rate for the TOF output signal 13t is the quotient of the output pixel clock frequency divided by the product of the total pixels per line and total lines per frame. For example, when the output format is 625i (625 lines interlaced) the frequency of the clock signal is 27 megahertz (standard definition clock), the total number of pixel clocks per line is 1728, and the total number of lines per frame is 625. Accordingly, the frame rate for the TOF output signal 13t equals 27,000,000/(1728*625)=25 hertz.

The resulting count signal 207f is provided as the TOF output signal 13t in accordance with control signals 57a, 57b. One control signal 57a determines whether the count signal 207f is passed through to become the TOF output signal 13t, or if the output signal 13t is disabled and set in a high impedance state. The outer control signal 57b establishes the TOF output signal 13t polarity, i.e., as an active high or an active low signal.

Figure 5:
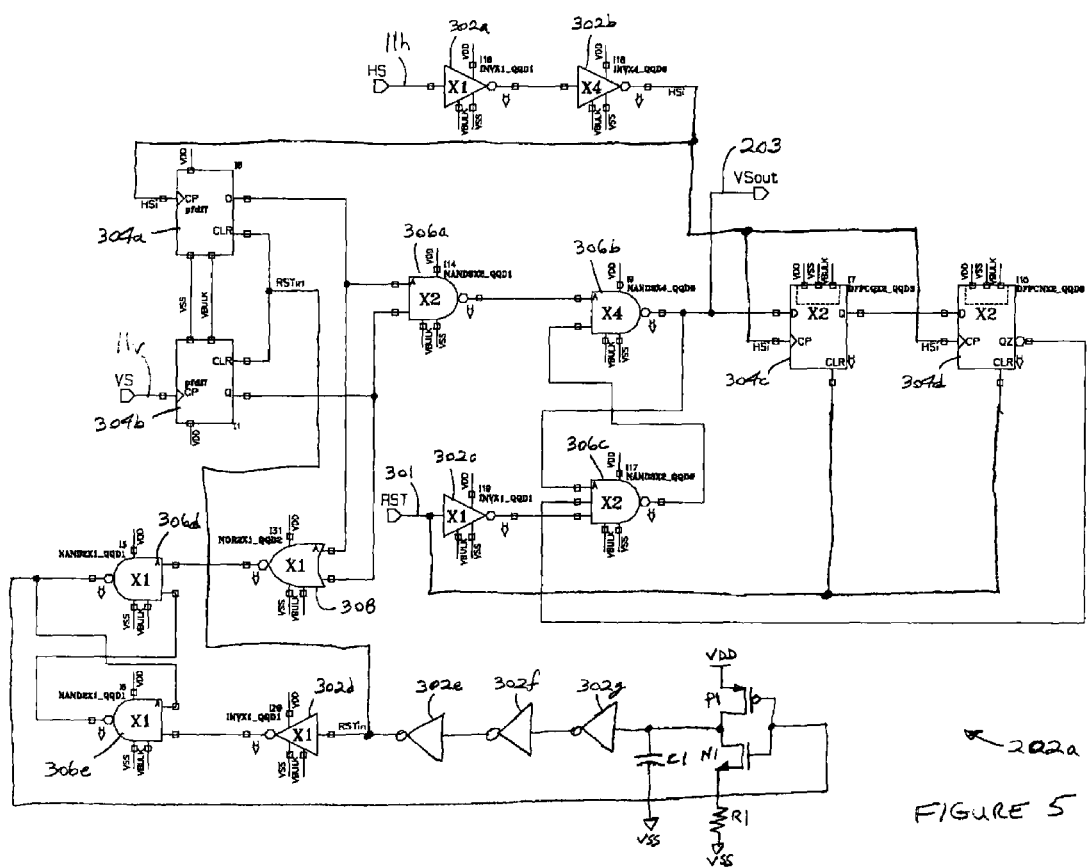
FIG. 5 is a logic diagram of one example embodiment of the field gating circuitry of FIG. 4.
Figure 1:
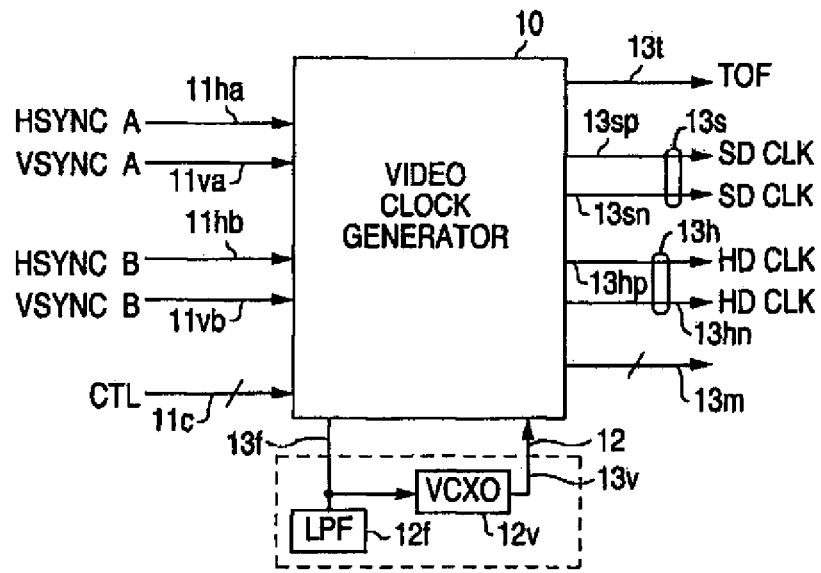
Figure 2:
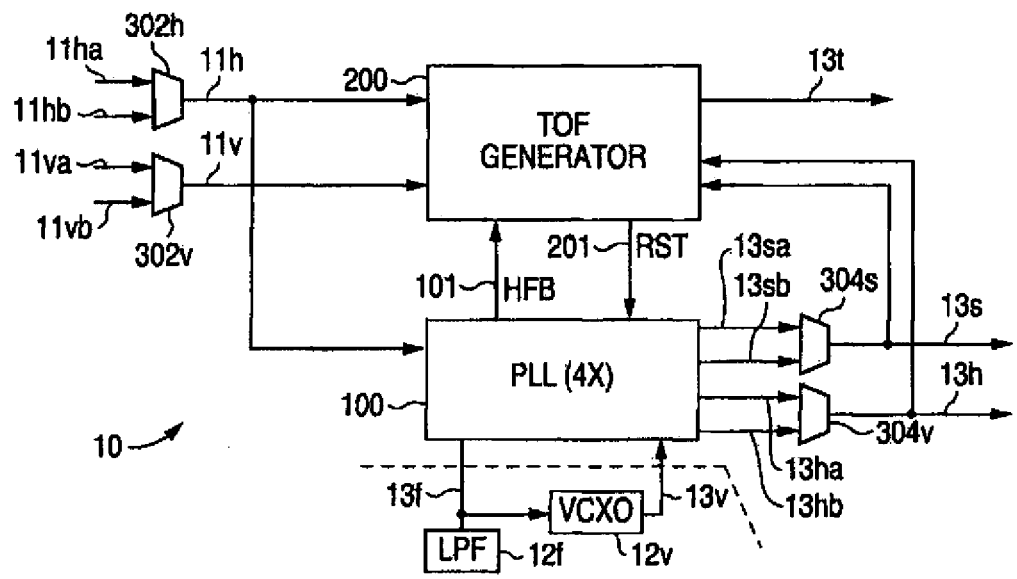
Figure 3A:
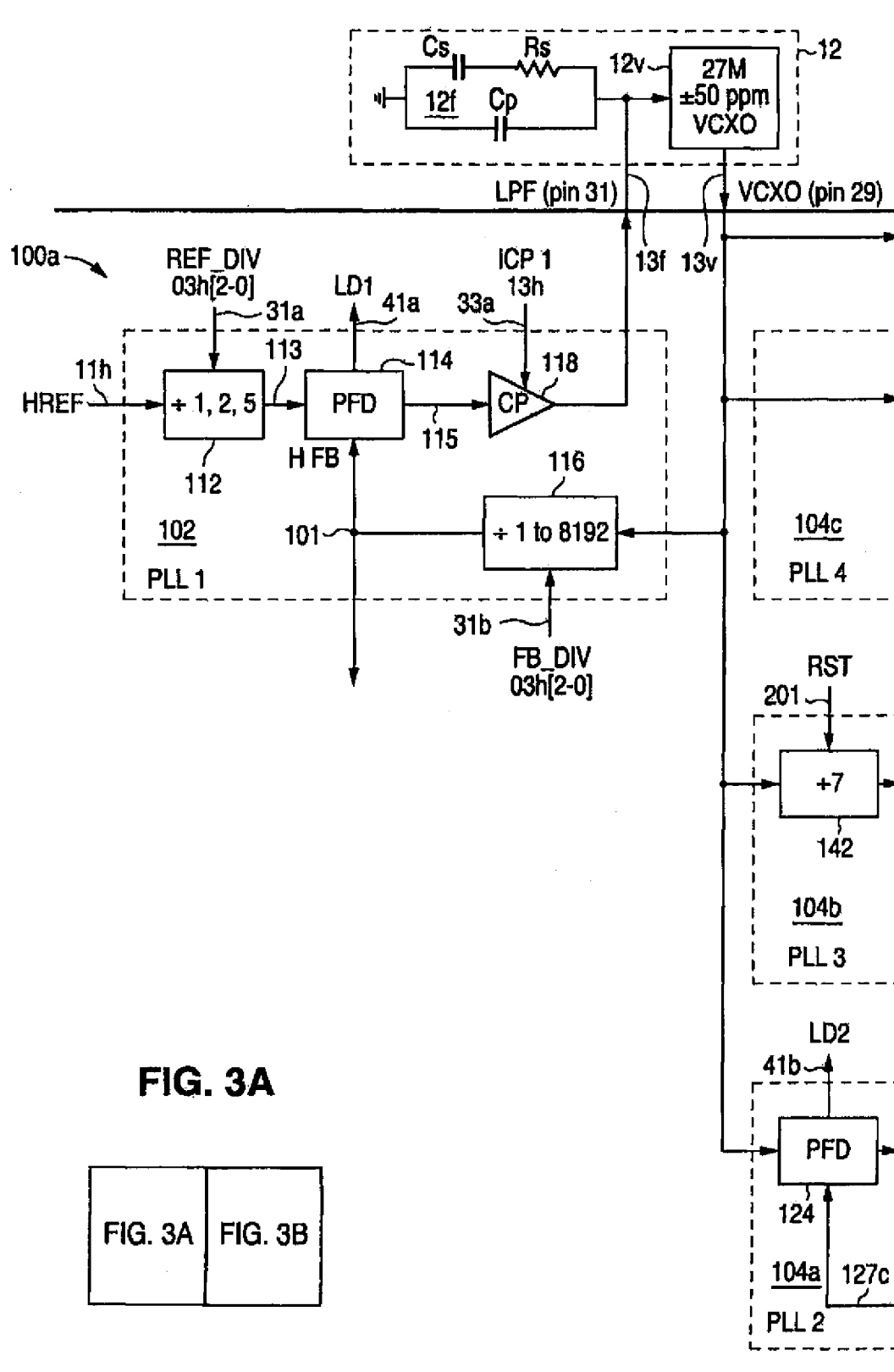
Figure 3B:
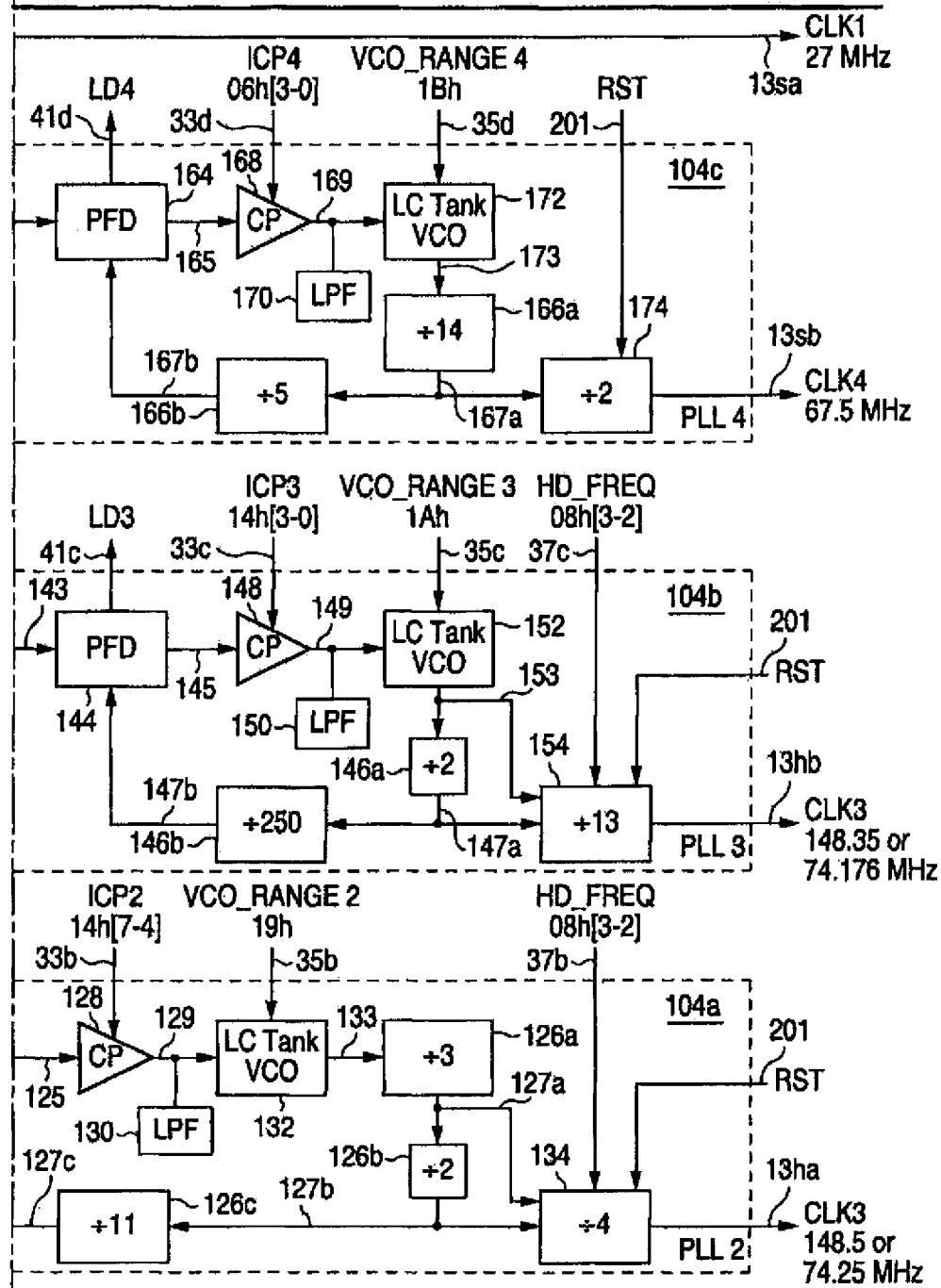
Figure 4:
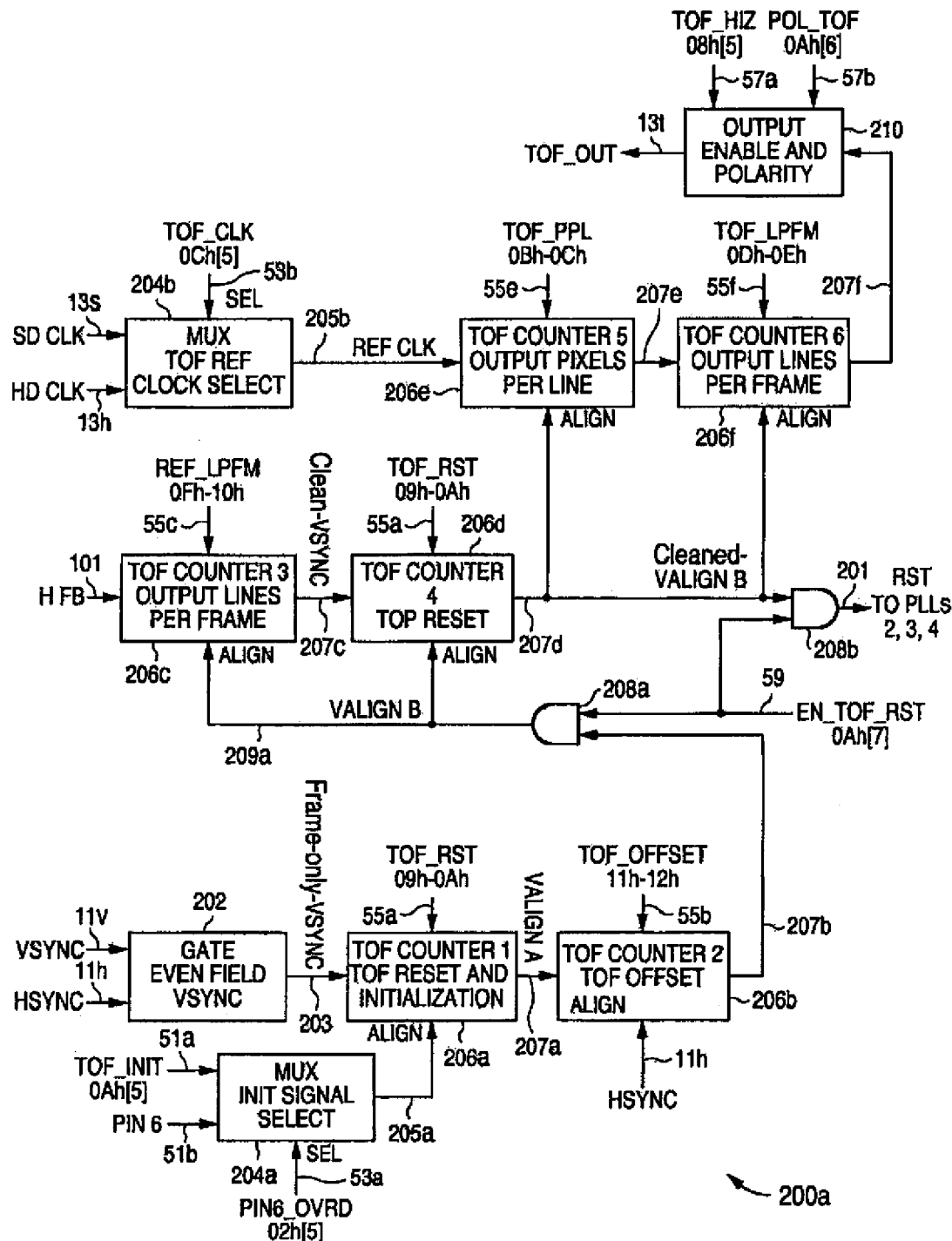
Figure 5A:
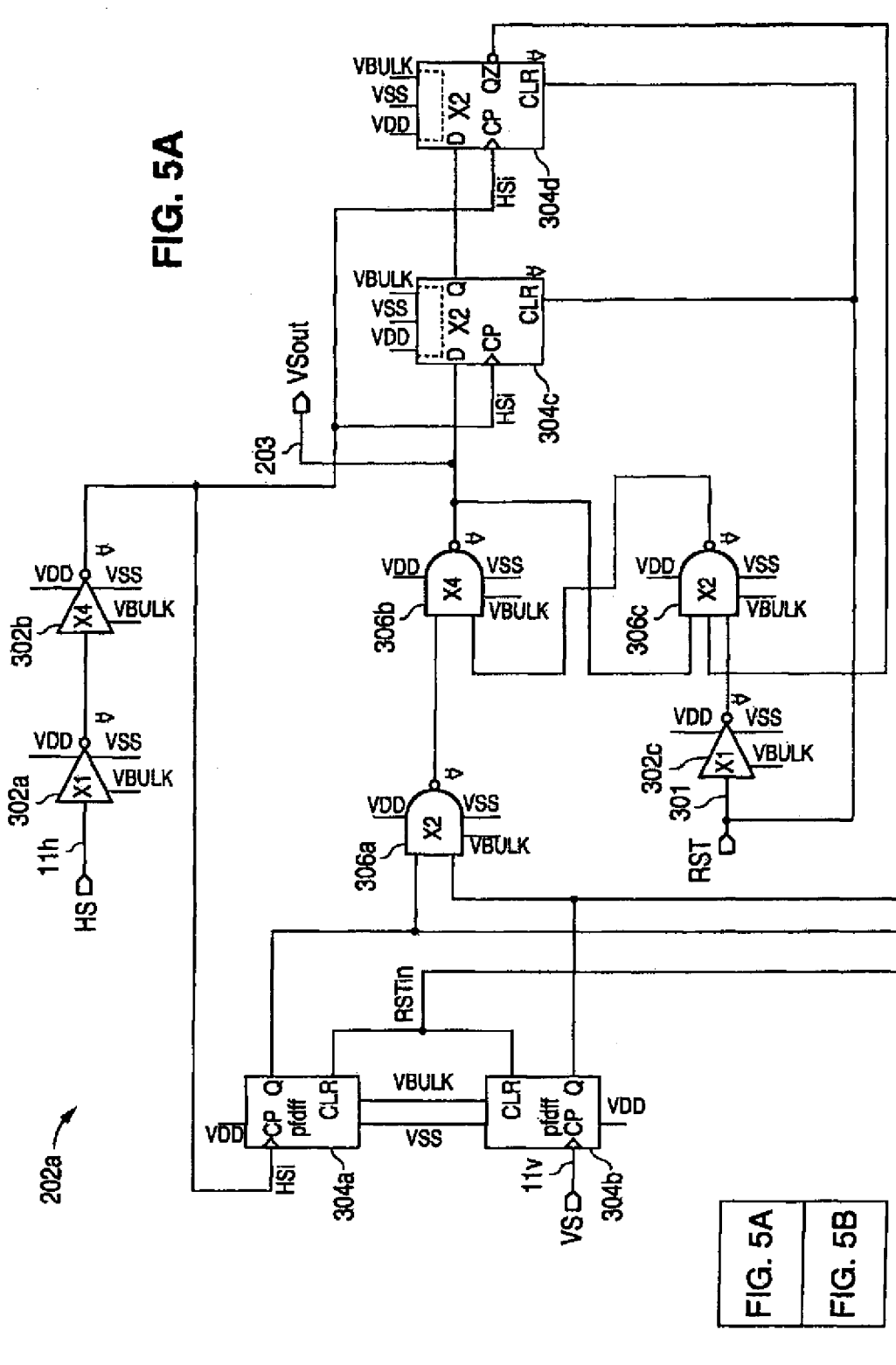
Figure 5B:
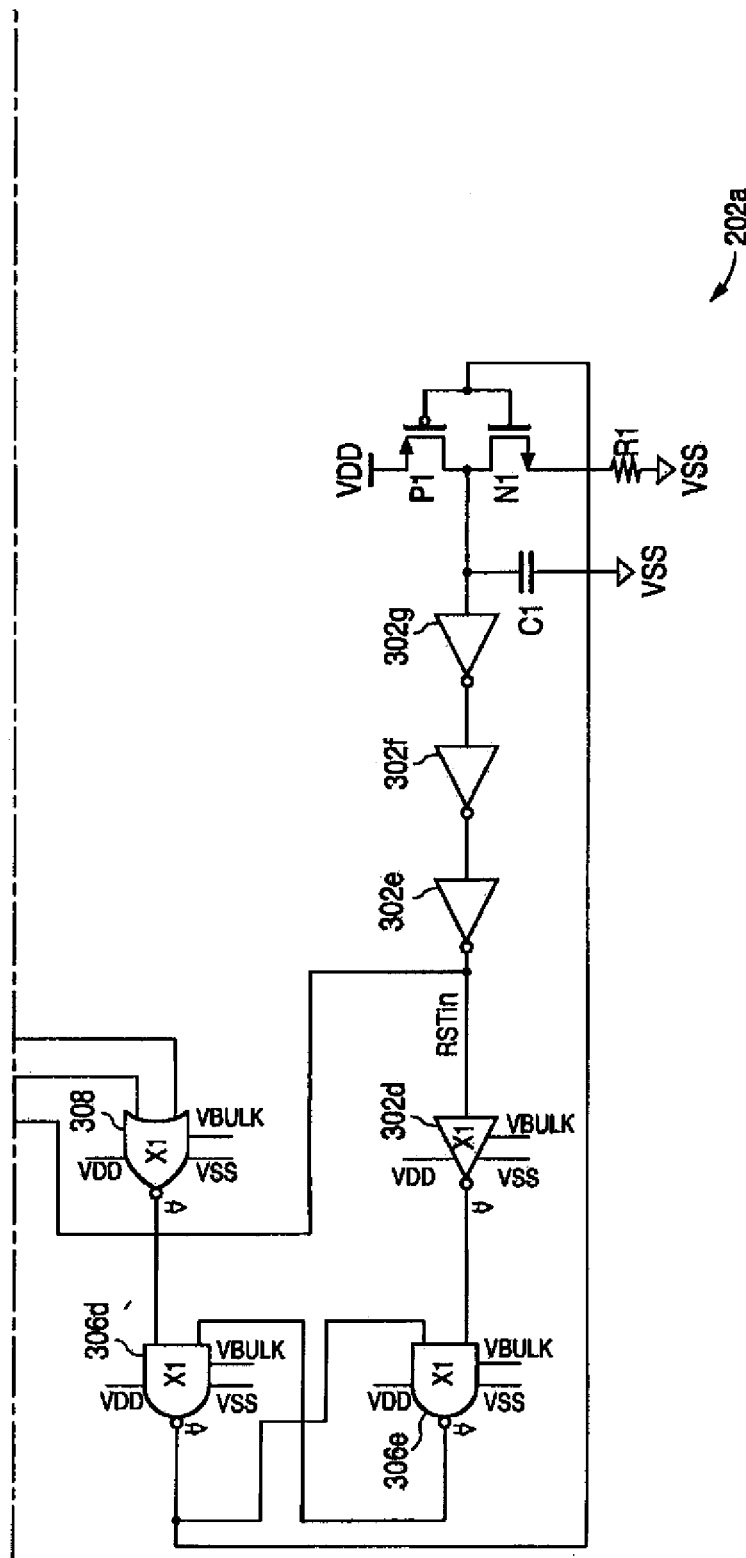
Figure 1:
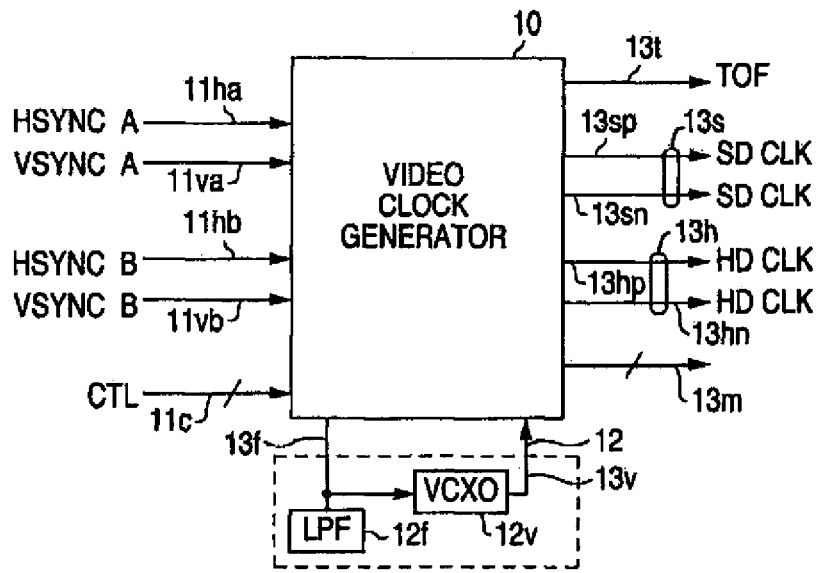
Figure 2:
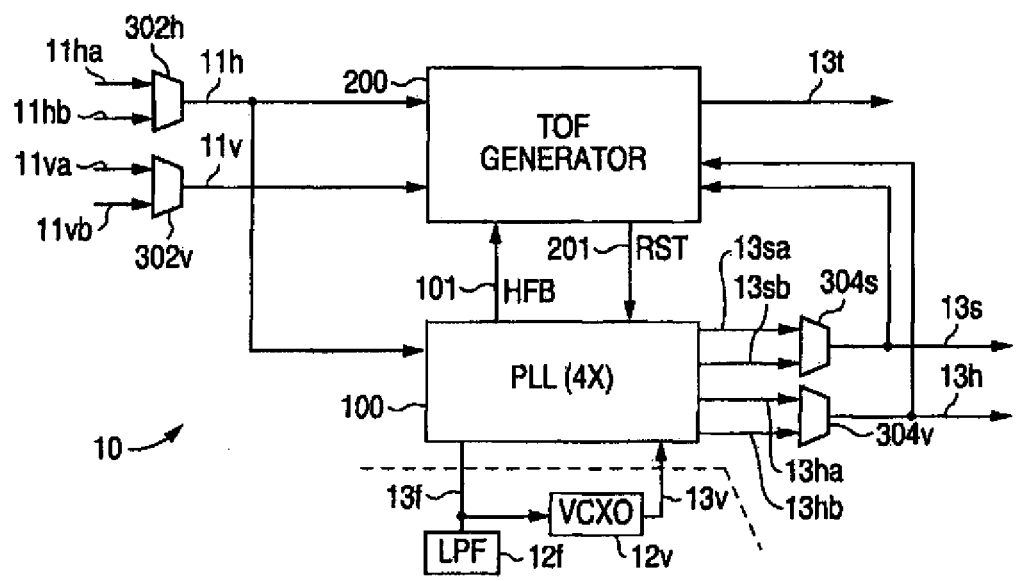
Figure 3A:
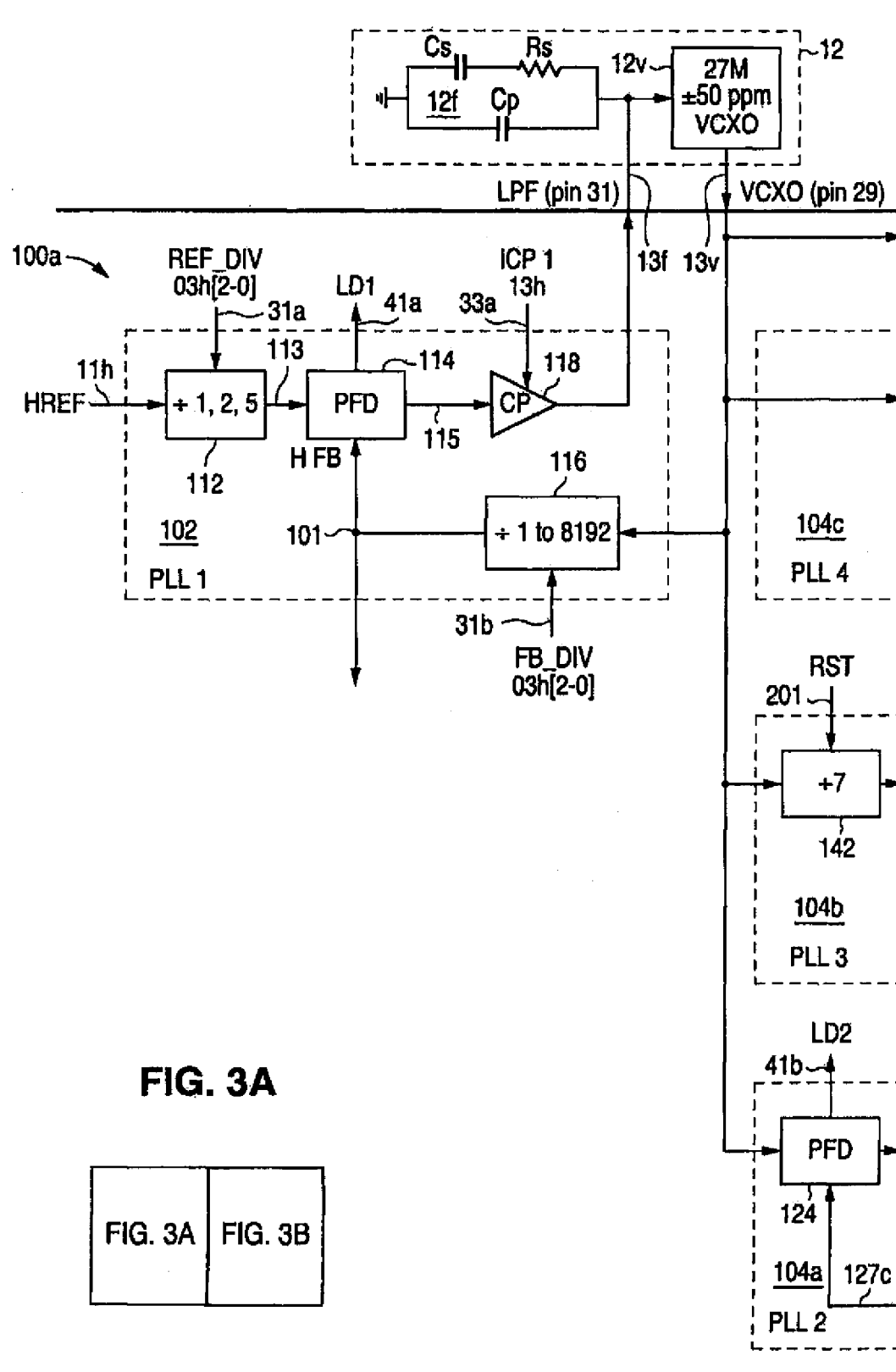
Figure 3B:
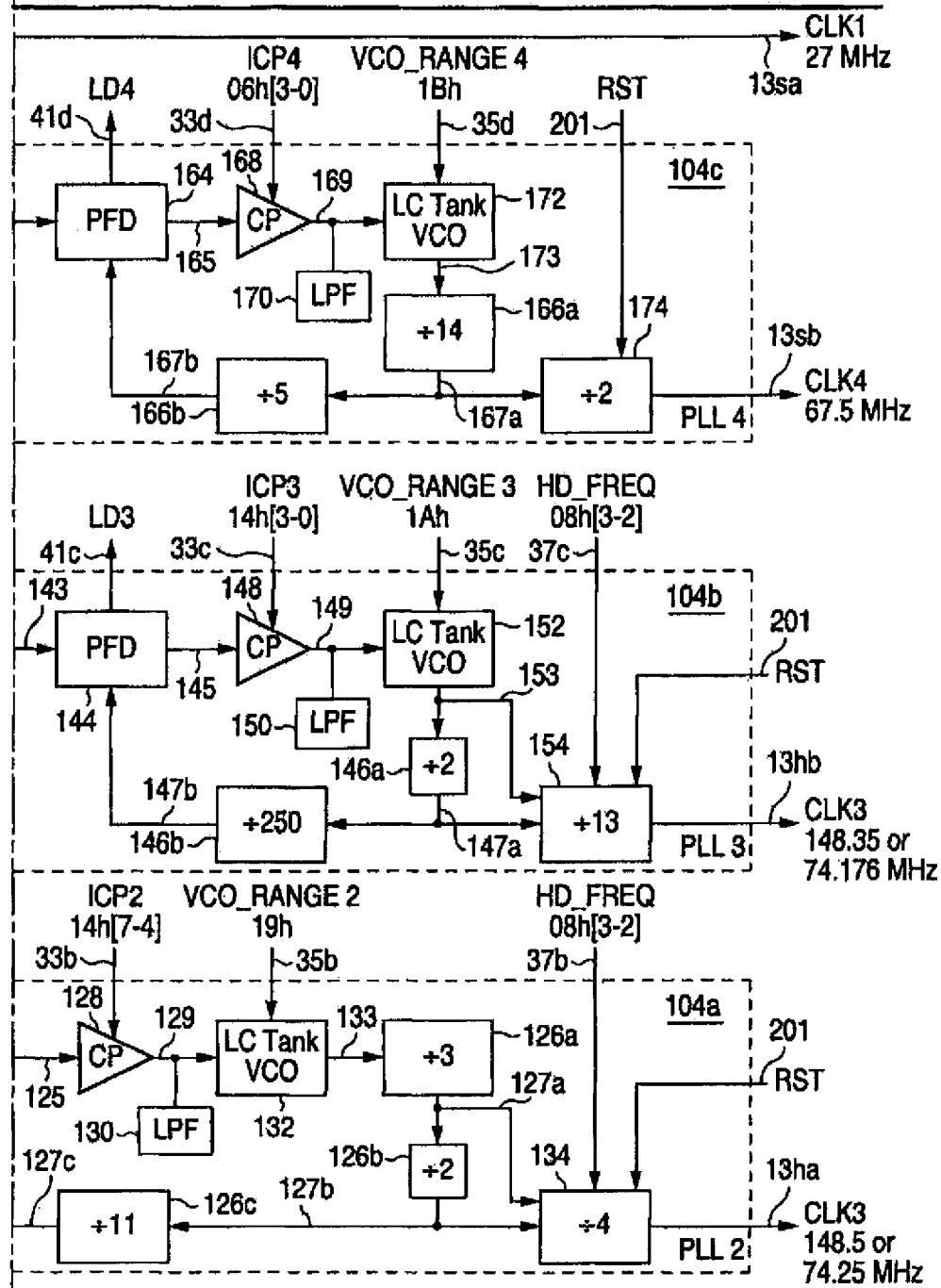
Figure 4:
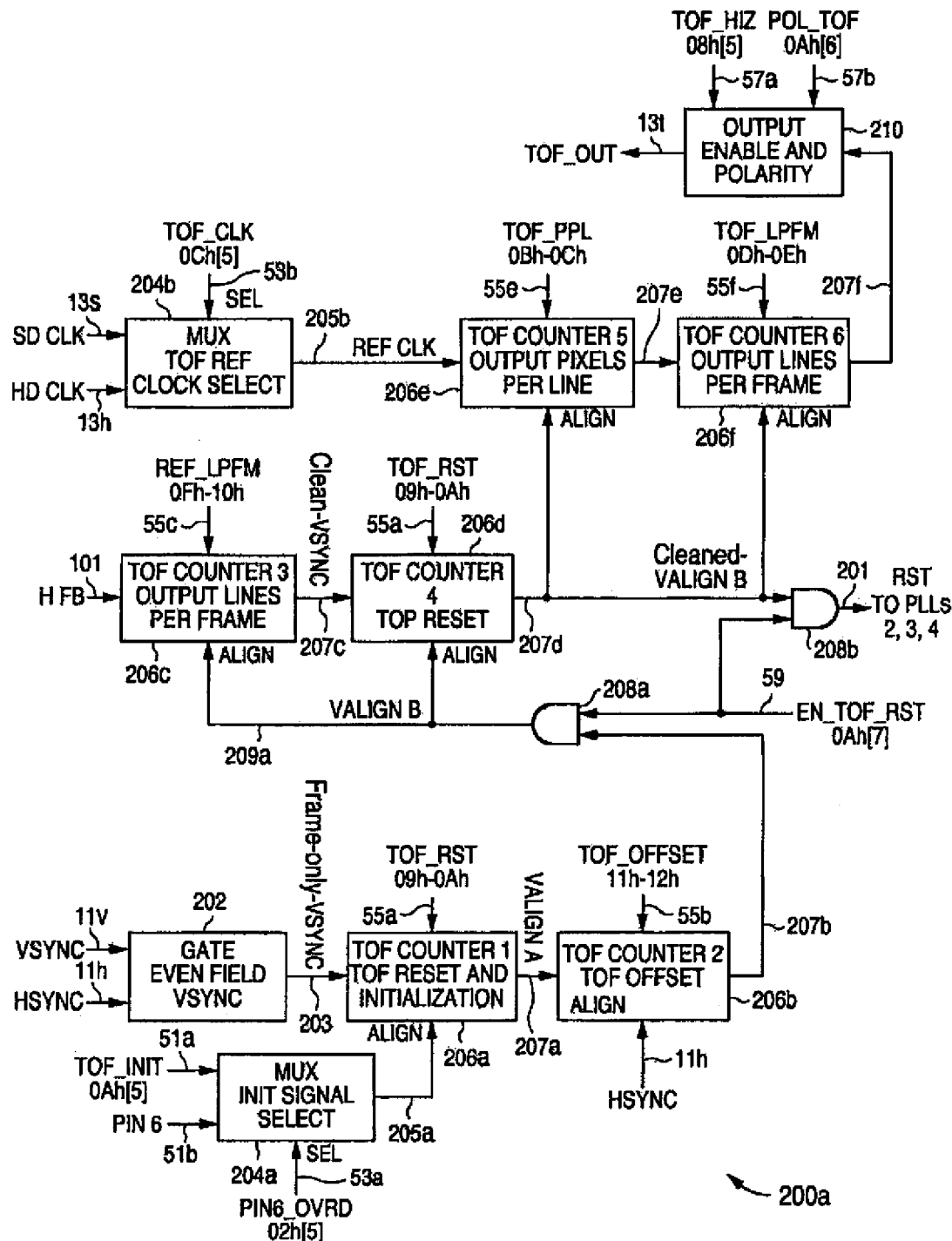
Figure 5A:
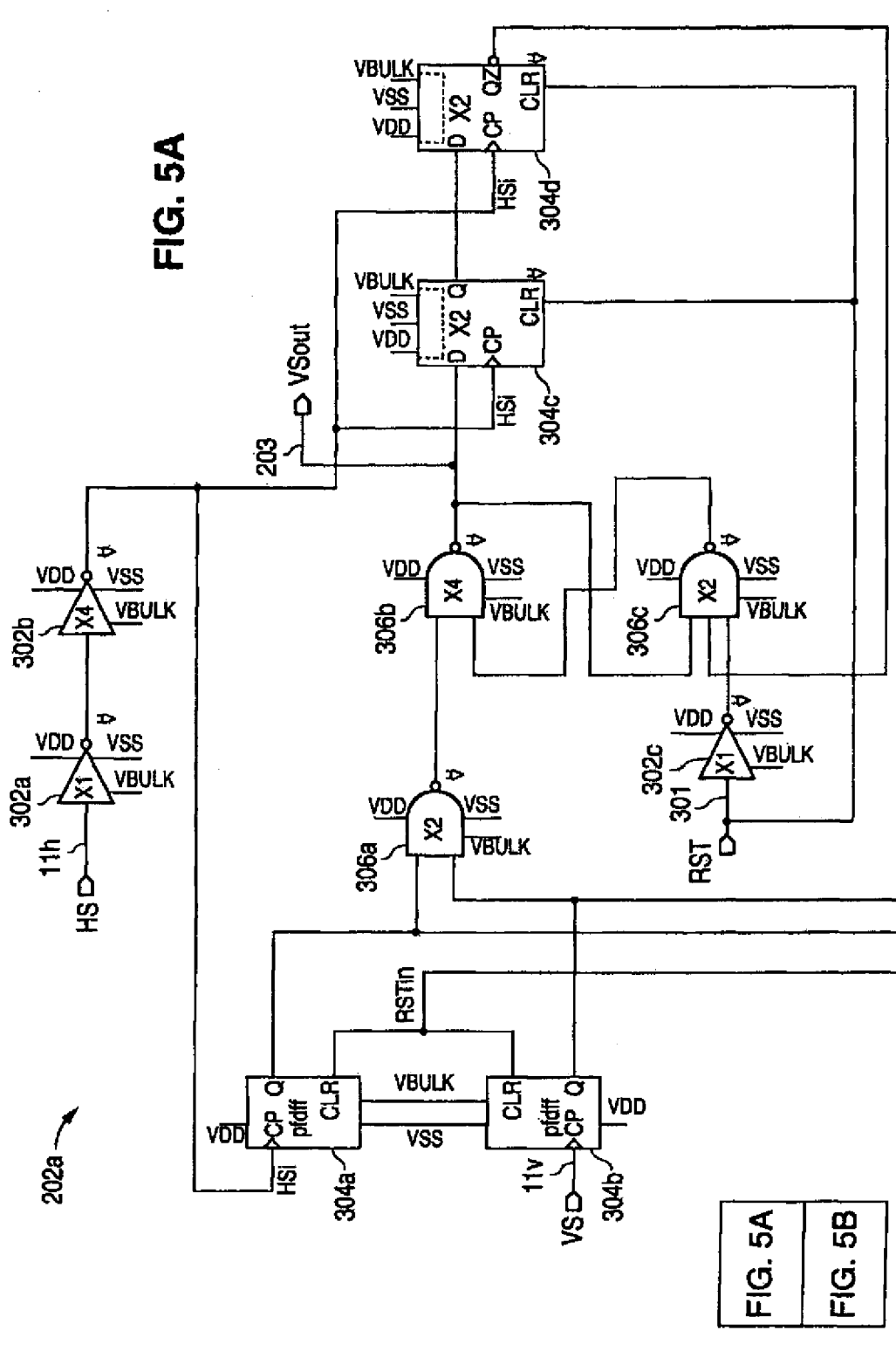
Figure 5B:
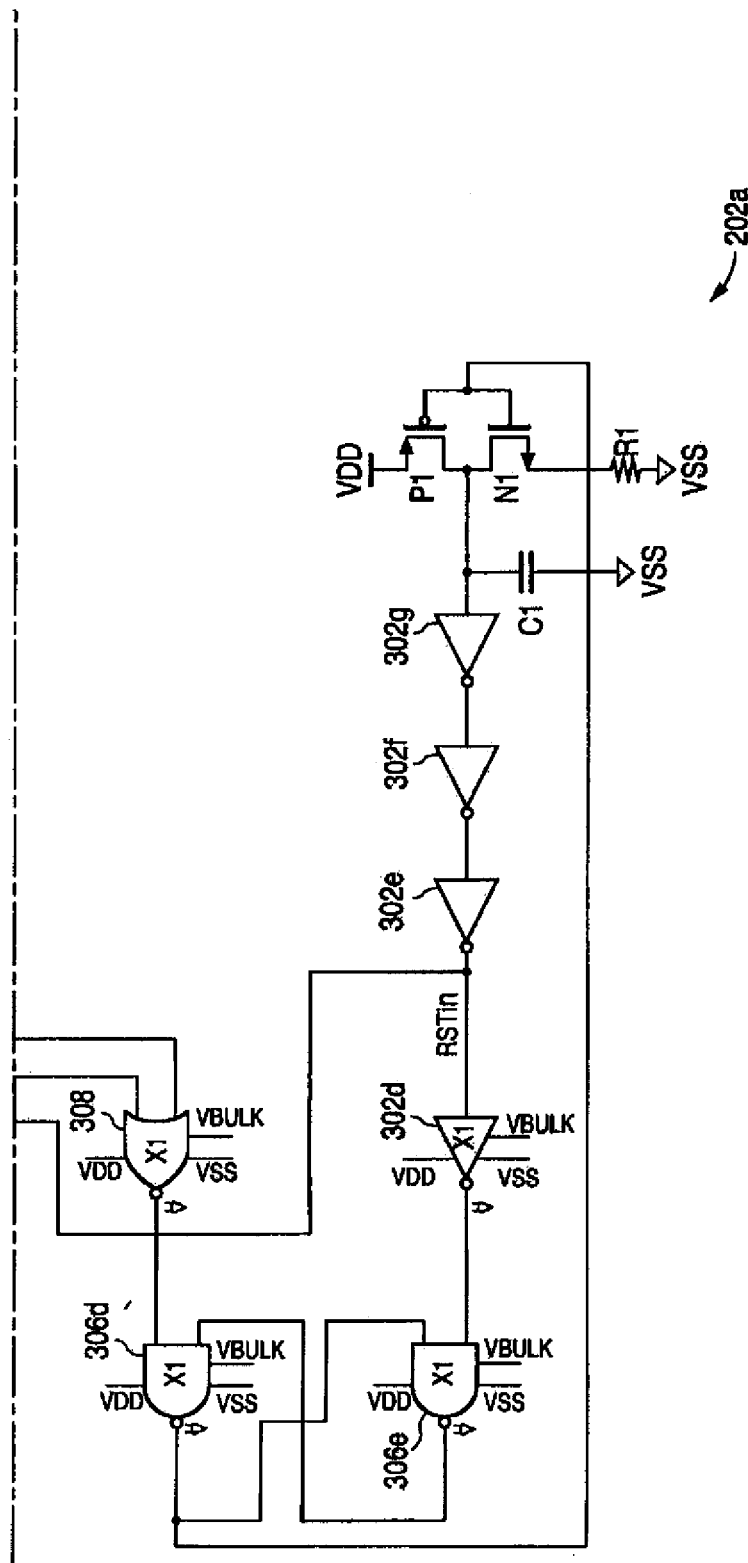

Referring to FIG. 5, one example embodiment 202a of the input gating signal 202 can be implemented using logic inverters 302a, 302b, 302c, 302d, 302e, 302f, 302g, D-type flip-flops 304a, 304b, 304c, 304d, logic NAND gates 306a, 306b, 306c, 306d, 306e, a logic NOR gate 308, complementary metal oxide semiconductor field effect transistors P1, N1, a resistance R1, and a capacitance C1, interconnected substantially as shown. As discussed above, this gating circuit 202a removes the vertical synchronization signal 11v information for the even field. This is done by monitoring the leading edges of the vertical 11v and horizontal 11h synchronization signals. If a leading edge of the vertical synchronization signal 11v is not within a prescribed time interval (e.g., 450 nanoseconds) either preceding or following a leading edge of the horizontal synchronization signal 11h, that portion of the vertical synchronization signal 11v is blocked, i.e., gated, out.

Various other modifications and alternations in the structure and method of operation of this invention will be apparent to those skilled in the art without departing from the scope and the spirit of the invention. Although the invention has been described in connection with specific preferred embodiments, it should be understood that the invention as claimed should not be unduly limited to such specific embodiments. It is intended that the following claims define the scope of the present invention and that structures and methods within the scope of these claims and their equivalents be covered thereby.

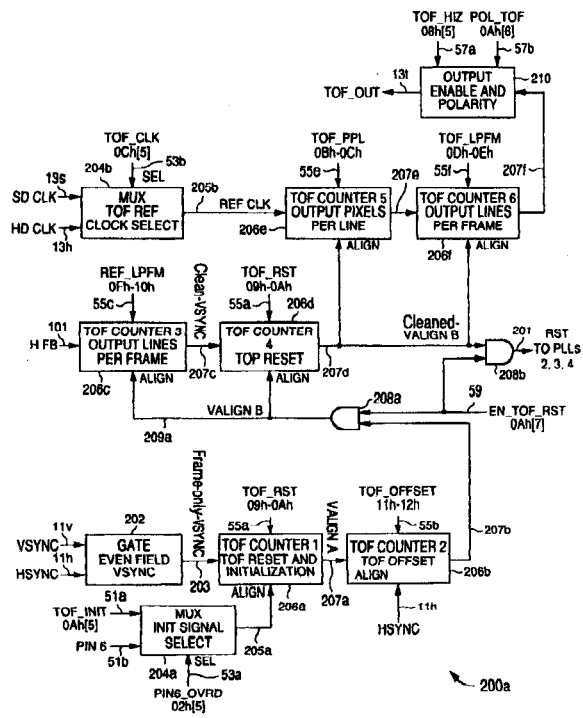

What is claimed is:

1. An apparatus including a signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate, comprising:
   gating circuitry responsive to input vertical and horizontal reference signals by providing a gated signal, wherein said input vertical reference signal is related to a vertical video synchronization signal for said input video signal, said input horizontal reference signal is related to a horizontal video synchronization signal for said input video signal, and said gated signal represents said input video frame;
   first counter circuitry coupled to said gating circuitry and responsive to said gated signal, first count control data and a first reset signal by providing a first count signal, wherein said first count control data is related to a ratio of said input and output video frame rates;
   second counter circuitry coupled to said first counter circuitry and responsive to said first count signal, second count control data and said input horizontal reference signal by providing a second count signal, wherein said second count control data is related to a predetermined line of said output video frame; and
   third counter circuitry coupled to said second counter circuitry and responsive to an input reference clock signal related to said input horizontal video synchronization signal, third count control data and said second count signal by providing a third count signal, wherein said third count control data is related to a reference plurality of video frame lines for a reference video frame having a reference video frame rate, and said third count signal is related to said output video frame rate.

2. The apparatus of claim 1, further comprising fourth counter circuitry coupled to said second counter circuitry and said third counter circuitry, and responsive to said third count signal, said first count control data and said second count signal by providing a fourth count signal.

3. The apparatus of claim 2, further comprising additional counter circuitry coupled to said fourth counter circuitry and responsive to an output reference clock signal, additional count control data and said fourth count signal by providing at least one additional count signal, wherein said additional count control data is related to at least one of said pluralities of output video pixels and frame lines, and said at least one additional count signal comprises said video top-of-frame signal.

4. The apparatus of claim 3, wherein said output reference clock signal is related to said reference video frame rate.

5. The apparatus of claim 2, further comprising:
   fifth counter circuitry coupled to said fourth counter circuitry and responsive to an output reference clock signal, fifth count control data and said fourth count signal by providing a fifth count signal, wherein said fifth count control data is related to said plurality of output video pixels; and
   sixth counter circuitry coupled to said fifth counter circuitry and responsive to said fifth count signal, sixth count control data and said fourth count signal by providing a sixth count signal, wherein said sixth count control data is related to said plurality of output video frame lines, and said sixth count signal comprises said video top-of-frame signal.

6. The apparatus of claim 5, wherein said output reference clock signal is related to said reference video frame rate.

7. An apparatus including a signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate, comprising:
  gating means for receiving input vertical and horizontal reference signals and in response thereto providing a gated signal, wherein said input vertical reference signal is related to a vertical video synchronization signal for said input video signal, said input horizontal reference signal is related to a horizontal video synchronization signal for said input video signal, and said gated signal represents said input video frame;
  first counter means for receiving said gated signal, first count control data and a first reset signal and in response thereto providing a first count signal, wherein said first count control data is related to a ratio of said input and output video frame rates;
  second counter means for receiving said first count signal, second count control data and said input horizontal reference signal and in response thereto providing a second count signal, wherein said second count control data is related to a predetermined line of said output video frame; and
  third counter means for receiving an input reference clock signal related to said input horizontal video synchronization signal, third count control data and said second count signal and in response thereto providing a third count signal, wherein said third count control data is related to a reference plurality of video frame lines for a reference video frame having a reference video frame rate, and said third count signal is related to said output video frame rate.

8. The apparatus of claim 7, further comprising fourth counter means for receiving said third count signal, said first count control data and said second count signal and in response thereto providing a fourth count signal.

9. The apparatus of claim 8, further comprising additional counter means for receiving an output reference clock signal, additional count control data and said fourth count signal and in response thereto providing at least one additional count signal, wherein said additional count control data is related to at least one of said pluralities of output video pixels and frame lines, and said at least one additional count signal comprises said video top-of-frame signal.

10. The apparatus of claim 9, wherein said output reference clock signal is related to said reference video frame rate.

11. The apparatus of claim 8, further comprising:
  fifth counter means for receiving an output reference clock signal, fifth count control data and said fourth count signal and in response thereto providing a fifth count signal, wherein said fifth count control data is related to said plurality of output video pixels; and
  sixth counter means for receiving said fifth count signal, sixth count control data and said fourth count signal and in response thereto providing a sixth count signal, wherein said sixth count control data is related to said plurality of output video frame lines, and said sixth count signal comprises said video top-of-frame signal.

12. The apparatus of claim 11, wherein said output reference clock signal is related to said reference video frame rate.

13. A method for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate, comprising:
  receiving input vertical and horizontal reference signals and in response thereto providing a gated signal, wherein said input vertical reference signal is related to a vertical video synchronization signal for said input video signal, said input horizontal reference signal is related to a horizontal video synchronization signal for said input video signal, and said gated signal represents said input video frame;
  receiving first count control data and a first reset signal and in response thereto counting said gated signal to provide a first count signal, wherein said first count control data is related to a ratio of said input and output video frame rates;
  receiving second count control data and said input horizontal reference signal and in response thereto counting said first count signal to provide a second count signal, wherein said second count control data is related to a predetermined line of said output video frame; and
  receiving third count control data and said second count signal and in response thereto counting an input reference clock signal related to said input horizontal video synchronization signal to provide a third count signal, wherein said third count control data is related to a reference plurality of video frame lines for a reference video frame having a reference video frame rate, and said third count signal is related to said output video frame rate.

14. The method of claim 13, further comprising receiving said first count control data and said second count signal and in response thereto counting said third count signal to provide a fourth count signal.

15. The method of claim 14, further comprising receiving additional count control data and said fourth count signal and in response thereto counting an output reference clock signal to provide at least one additional count signal, wherein said additional count control data is related to at least one of said pluralities of output video pixels and frame lines, and said at least one additional count signal comprises said video top-of-frame signal.

16. The method of claim 15, wherein said output reference clock signal is related to said reference video frame rate.

17. The method of claim 14, further comprising:
  receiving fifth count control data and said fourth count signal and in response thereto counting an output reference clock signal to provide a fifth count signal, wherein said fifth count control data is related to said plurality of output video pixels; and
  receiving sixth count control data and said fourth count signal and in response thereto counting said fifth count signal to provide a sixth count signal, wherein said sixth count control data is related to said plurality of output video frame lines, and said sixth count signal comprises said video top-of-frame signal.

18. The method of claim 17, wherein said output reference clock signal is related to said reference video frame rate.

* * * * *

UNITED STATES PATENT AND TRADEMARK OFFICE
CERTIFICATE OF CORRECTION

PATENT NO. : 8,115,871 B2
APPLICATION NO. : 12/102278
DATED : February 14, 2012
INVENTOR(S) : Dongwei Chen It is certified that error appears in the above-identified patent and that said Letters Patent is hereby corrected as shown below:

Figs. 1-5 appearing on Sheets 1-4 to be replaced with Figs. 1-5 appearing on Replacement Sheets 1-6.

Signed and Sealed this
Twenty-second Day of May, 2012

David J. Kappos
*Director of the United States Patent and Trademark Office*

| FIG. 3A | FIG. 3B |
|---|---|

UNITED STATES PATENT AND TRADEMARK OFFICE
CERTIFICATE OF CORRECTION

| | | |
|---|---|---|
| PATENT NO. | : 8,115,871 B2 | Page 1 of 8 |
| APPLICATION NO. | : 12/102278 | |
| DATED | : February 14, 2012 | |
| INVENTOR(S) | : Dongwei Chen | |

It is certified that error appears in the above-identified patent and that said Letters Patent is hereby corrected as shown below:

Delete the title page and substitute therefore the attached title page consisting of the corrected illustrative figure.

Figs. 1-5 appearing on Sheets 1-4 to be replaced with Figs. 1-5 appearing on Replacement Sheets 1-6.

This certificate supersedes the Certificate of Correction issued May 22, 2012.

Signed and Sealed this
Nineteenth Day of June, 2012

David J. Kappos
*Director of the United States Patent and Trademark Office*

(12) United States Patent
Chen

(10) Patent No.: US 8,115,871 B2
(45) Date of Patent: Feb. 14, 2012

(54) VIDEO TOP-OF-FRAME SIGNAL GENERATOR FOR MULTIPLE VIDEO FORMATS

(75) Inventor: Dongwei Chen, Fremont, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 975 days.

(21) Appl. No.: 12/102,278

(22) Filed: Apr. 14, 2008

(65) Prior Publication Data

US 2009/0256960 A1    Oct. 15, 2009

(51) Int. Cl.
*H04N 5/06* (2006.01)

(52) U.S. Cl. ........ 348/521; 348/522; 348/524; 348/540; 348/547; 375/355

(58) Field of Classification Search ............. 348/521, 348/522, 524, 540, 547, 525; 375/355, 363–366
See application file for complete search history.

(56) References Cited

U.S. PATENT DOCUMENTS

| | | | | |
|---|---|---|---|---|
| 5,132,793 A | * | 7/1992 | Hirahata et al. | 348/556 |
| 6,473,195 B1 | | 10/2002 | Yun et al. | |
| 7,777,813 B2 | * | 8/2010 | Uno et al. | 348/506 |
| 8,059,200 B2 | * | 11/2011 | Chen | 348/536 |
| 2006/0017984 A1 | | 1/2006 | Lee | |

OTHER PUBLICATIONS

International Search Report corresponding to PCT/US2009/039617 filed Apr. 6, 2009, 3 pages.
Written Opinion of the International Searching Authority corresponding to PCT/US2009/039617 filed Apr. 6, 2009, 4 pages.
Lattice Semiconductor Corporation, "SMPTE SDI Demo User's Guide", Nov. 2007, pp. 1-23.
Gennum, GS4911B/GS4910B Data Sheet. "GS4911B/GS4910B HD/SD/ Graphics Clock and Timing Generator with GENLOCK", Apr. 2007, pp. 1-113.

* cited by examiner

*Primary Examiner* — Brian T Pendleton
*Assistant Examiner* — Nnenna Ekpo

(57) ABSTRACT

A signal generator for use in producing a video top-of-frame signal based upon an input video signal with an input video frame including one or more input video fields and having an input video frame rate for an output video signal with an output video frame having a plurality of output video frame lines, each with a plurality of output video pixels, and an output video frame rate.

18 Claims, 4 Drawing Sheets